United States Patent
Mochizuki et al.

(10) Patent No.: US 8,822,939 B2
(45) Date of Patent: Sep. 2, 2014

(54) MATRIX SUBSTRATE, DETECTION DEVICE, DETECTION SYSTEM, AND METHOD FOR DRIVING DETECTION DEVICE

(75) Inventors: Chiori Mochizuki, Sagamihara (JP); Minoru Watanabe, Honjo (JP); Keigo Yokoyama, Honjo (JP); Masato Ofuji, Honjo (JP); Jun Kawanabe, Kodama-gun (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 276 days.

(21) Appl. No.: 13/323,187

(22) Filed: Dec. 12, 2011

(65) Prior Publication Data

US 2012/0154353 A1    Jun. 21, 2012

(30) Foreign Application Priority Data

Dec. 16, 2010    (JP) ................. 2010-281057

(51) Int. Cl.
 *G01G 5/00*  (2006.01)
 *H01L 27/146*  (2006.01)
 *G09G 3/36*  (2006.01)

(52) U.S. Cl.
 CPC ........ *H01L 27/14663* (2013.01); *G09G 3/3659* (2013.01)
 USPC ................................. 250/370.11

(58) Field of Classification Search
 CPC .............................. H03K 17/005; G09G 5/00
 USPC ................................. 250/370.11
 See application file for complete search history.

(56) References Cited

U.S. PATENT DOCUMENTS

| | | |
|---|---|---|
| 5,536,932 A | 7/1996 | Hack |
| 2001/0015715 A1 | 8/2001 | Hebiguchi |
| 2002/0191828 A1* | 12/2002 | Colbeth et al. ................ 382/132 |
| 2002/0196898 A1 | 12/2002 | Kameshima |
| 2005/0134541 A1* | 6/2005 | Jang et al. ....................... 345/94 |
| 2009/0302229 A1* | 12/2009 | Watanabe et al. ......... 250/370.08 |
| 2009/0309035 A1* | 12/2009 | Kameshima ............. 250/370.09 |

FOREIGN PATENT DOCUMENTS

| | | |
|---|---|---|
| EP | 1471368 A1 | 10/2004 |
| JP | 2009-294424 A | 12/2009 |
| WO | 97/05505 A1 | 2/1997 |
| WO | 2009/031693 A1 | 3/2009 |

* cited by examiner

*Primary Examiner* — Marcus Taningco
(74) *Attorney, Agent, or Firm* — Canon USA, Inc. IP Division

(57) ABSTRACT

A matrix substrate which realizes high operation speed and high reliability and which is capable of obtaining a high-quality image while the number of connection terminals is limited is provided. The matrix substrate includes pixels arranged in a matrix, N driving lines arranged in a row direction, P connection terminals where P is less than N, a demultiplexer which is disposed between the connection terminals and the driving lines and which includes first polycrystalline semiconductor TFTs and first connection terminals. The demultiplexer further includes second polycrystalline semiconductor TFTs and the second control lines used to maintain the driving lines to have non-selection voltages which bring the pixels to non-selection states between one of the connection terminals and two or more of the driving lines.

11 Claims, 11 Drawing Sheets

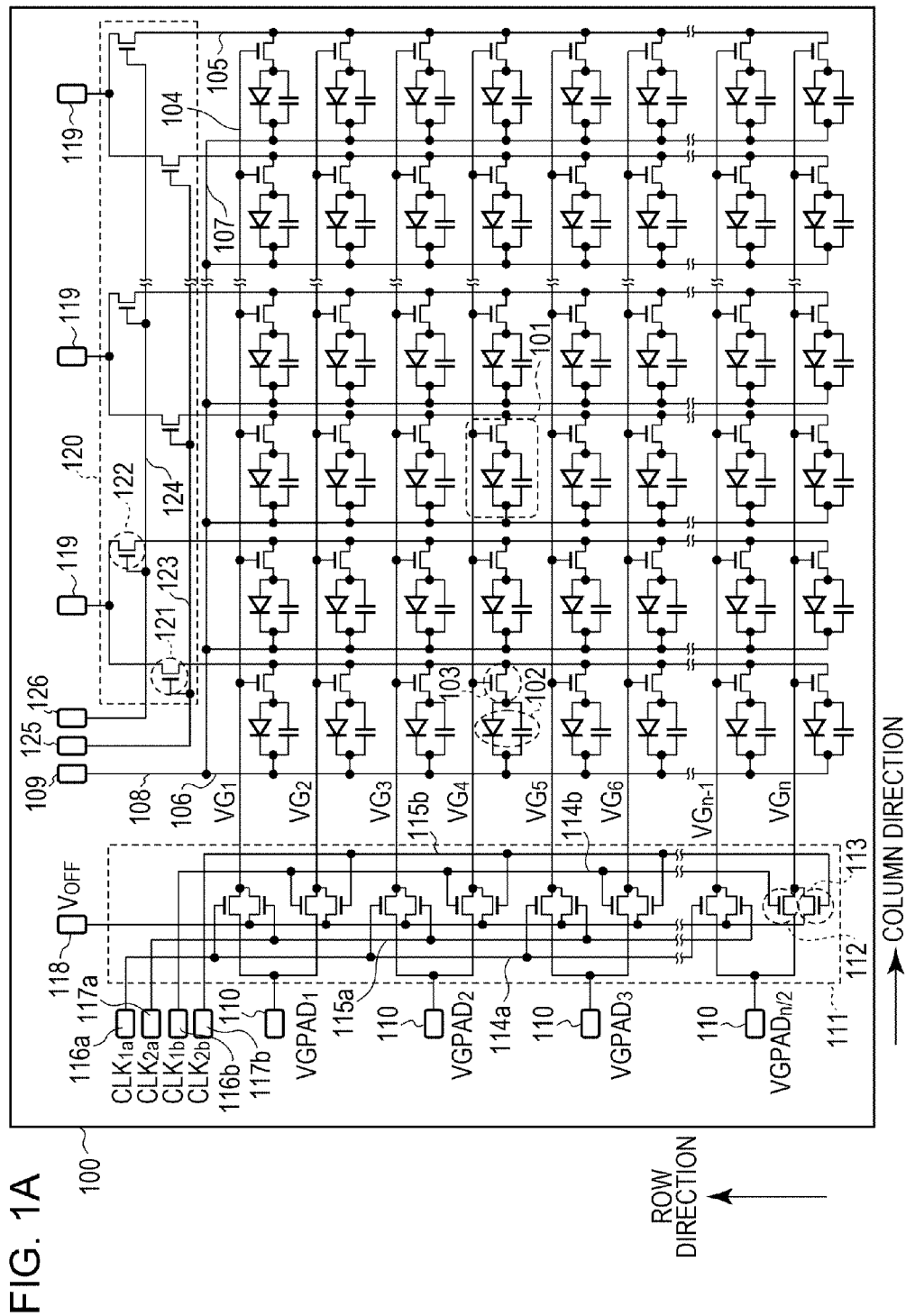

MATRIX SUBSTRATE, DETECTION DEVICE, DETECTION SYSTEM, AND METHOD FOR DRIVING DETECTION DEVICE

BACKGROUND OF THE INVENTION

1. Field of the Invention

Embodiments of the present invention relate to a matrix substrate, a detection device, and a detection system which are employed in a medical image diagnosis apparatus, a non-destructive testing apparatus, and an analysis apparatus using radiation.

2. Description of the Related Art

In recent years, a thin-film semiconductor fabrication technique has been employed in fabrication of a matrix substrate having an array (pixel array) of pixels each of which includes a combination of a switching element such as a TFT (thin-film transistor) and a conversion element such as a photoelectric conversion element and has also been employed in fabrication of a detection device and a radiation detection device employing the matrix substrate.

In recent years, a detection device employing a TFT using a polycrystalline semiconductor such as polysilicon (p-Si) has been discussed. U.S. Pat. No. 5,536,932 discloses the following content. A detection device includes a demultiplexer having a plurality of p-SiTFTs arranged between an external gate terminal having one-to-one correspondence with a terminal of an external shift register and a plurality of gate lines (driving lines) so that the p-SiTFTs correspond to the plurality of gate lines. Furthermore, the demultiplexer includes a plurality of amorphous silicon (a-Si) TFTs used to cause the gate lines to have off-state voltages of TFTs of pixels. The a-SiTFTs are constantly in an on state and cause the gate lines to maintain the off-state voltages through resistors of 1 to 5 MΩ. On the other hand, when the p-SiTFTs having resistances lower than those of the a-SiTFTs are turned on, on-state voltages are supplied to the gate lines. However, in U.S. Pat. No. 5,536,932, since the gate lines are maintained to have the off-state voltages by the a-SiTFTs, a long period of time is required until the gate lines have the off-state voltages. This is because the high resistances of the a-SiTFTs cause influence of a time constant, and accordingly, a long period of time is required until the gate lines have the off-state voltages.

Furthermore, since on-state voltages of 5 V are constantly applied to gates of the a-SiTFTs, it is highly likely that Vth shifts of the a-SiTFTs occur which is a large problem in terms of reliability.

Moreover, when this configuration is used as a substrate of a detection device, it is likely that artifact such as crosstalk is generated in signals obtained from a pixel array. Since the a-SiTFT are constantly on-states, depending on resistance values thereof, the gate lines in which the off-state voltages should be maintained may be affected by the on-state voltages from the gate lines to which the on-state voltages have been supplied through the resistors of the a-SiTFTs. In addition, when lines used to supply the off-state voltages to the a-SiTFTs intersect with data lines (signal lines), the gate lines in which influence of the off-state voltages should be maintained may be affected by potential change of the data lines through the lines used to supply the off-state voltages to the a-SiTFTs.

SUMMARY OF THE INVENTION

Accordingly, one disclosed aspect of the embodiments provides a matrix substrate capable of ensuring a high operation speed and reliability while the number of external gate terminals is limited, a detection device, a detection system, and a method for driving the detection device which are capable of obtain a high-quality image.

According to an embodiment, there is provided a matrix substrate including a plurality of pixels which output electric signals in accordance with a radial ray or a light beam and which are arranged in a matrix, a plurality of driving lines which are arranged in a row direction and each of which is connected to a plurality of pixels in common in a column direction, a plurality of connection terminals which connect a driving circuit which drives the pixels and the driving lines with each other and the number of which is smaller than the number of driving lines, and a demultiplexer which is arranged between the connection terminals and the driving lines and which includes a plurality of first polysilicon thin-film transistors (TFTs) which correspond to the driving lines in a one-to-one manner and which supply first voltages which bring the pixels to be selection states to the driving lines and includes first control lines which supply conductive voltages and nonconductive voltages of the first polysilicon TFTs to control electrodes of the first polysilicon TFTs. The demultiplexer includes a plurality of second polysilicon TFTs which are arranged between the connection terminals and the driving lines, which correspond to the driving lines in a one-to-one manner, and which maintain the driving lines to have second voltages which bring the pixels to be non-selection states and includes second control lines which supply conductive voltages and nonconductive voltages of the second polysilicon TFTs to control electrodes of the second polysilicon TFTs.

According to another embodiment, there is provided a detection device including the matrix substrate, the driving circuit, and a control circuit which supplies conductive voltages and nonconductive voltages of the first polysilicon TFTs to the first control lines and supplies conductive voltages and nonconductive voltages of the second polysilicon TFTs to the second control lines. When voltages used to supply the first voltages to the driving lines are supplied to the connection terminals, the control circuit brings some of the first polysilicon TFTs which are located between the connection terminals and certain driving lines, among the driving lines, to conductive states and brings some of the second polysilicon TFTs which are located between the connection terminals and the certain driving lines to nonconductive states so that the first voltages are supplied to the certain driving lines, the other of the first polysilicon TFTs located between the connection terminals and the other of the driving lines which are different from the certain driving lines are brought to nonconductive states, and the other of the second polysilicon TFTs located between the connection terminals and the other of the driving lines are maintained to be conductive states so that the other driving lines are maintained to have the second voltages.

According to still another embodiment, there is provided a detection system including the detection device, a signal processor which processes a signal supplied from the detection device, a recording unit which records a signal supplied from the signal processor, a display unit which displays the signal supplied from the signal processor, and a transmission processor which transmits the signal supplied from the signal processor.

According to a further embodiment, there is provided a method for driving a detection device including a plurality of pixels which output electric signals in accordance with a radial ray or a light beam and which are arranged in a matrix, a plurality of driving lines which are arranged in a row direction and each of which is connected to a plurality of pixels in common in a column direction, a plurality of connection terminals which connect a driving circuit which drives the pixels and the driving lines with each other and the number of which is smaller than the number of driving lines, and a demultiplexer which is arranged between the connection terminals and the driving lines and which includes a plurality of first polysilicon TFTs which correspond to the driving lines in a one-to-one manner and which supply first voltages which bring the pixels to be selection states to the driving lines and includes a plurality of second polysilicon TFTs which correspond to the driving lines in a one-to-one manner and which maintain the driving lines to have second voltages which bring the pixels to be non-selection states. When voltages used to supply the first voltages to the driving lines are supplied to the connection terminals, some of the first polysilicon TFTs which are located between the connection terminals and certain driving lines, among the driving lines, are brought to conductive states and some of the second polysilicon TFTs which are located between the connection terminals and the certain driving lines are brought to nonconductive states so that the first voltages are supplied to the certain driving lines, the other of the first polysilicon TFTs located between the connection terminals and the other of the driving lines which are different from the certain driving lines are brought to nonconductive states, and the other of the second polysilicon TFTs located between the connection terminals and the other of the driving lines are maintained to be conductive states so that the other driving lines are maintained to have the second voltages.

According to the embodiments, the number of connection terminals for driving disposed in a matrix substrate is reduced to a number substantially the same as a sum of a value obtained by dividing the number of driving lines by the number of performances of a demultiplexing process of a demultiplexer and double of the number of performances of the demultiplexing process. For example, for a pixel array in a matrix of 2000 rows and 2000 columns, the number of connection terminals for driving is 508 when a demultiplexer which performs a one-to-four demultiplexing process is employed. Furthermore, since the demultiplexer includes a plurality of second polysilicon TFTs and a plurality of control lines so that switching elements are maintained to have nonconductive voltages, the second polysilicon TFTs having high reliability may be obtained. In addition, when the matrix substrate is used in a detection device, influence by an adjacent driving ling and a signal line intersect with a second control line may be prevented. Accordingly, one embodiment provides a matrix state capable of ensuring high operation speed and reliability while the number of external gate terminals is limited, a detection device, a detection system, and a method for driving the detection device which are capable of obtain a high-quality image.

Further features of the embodiments will become apparent from the following description of exemplary embodiments with reference to the attached drawings.

BRIEF DESCRIPTION OF THE DRAWINGS

FIG. 1A is an equivalent circuit diagram of a detection device and a matrix substrate according to a first embodiment.

DESCRIPTION OF THE EMBODIMENTS

Figure 1B:
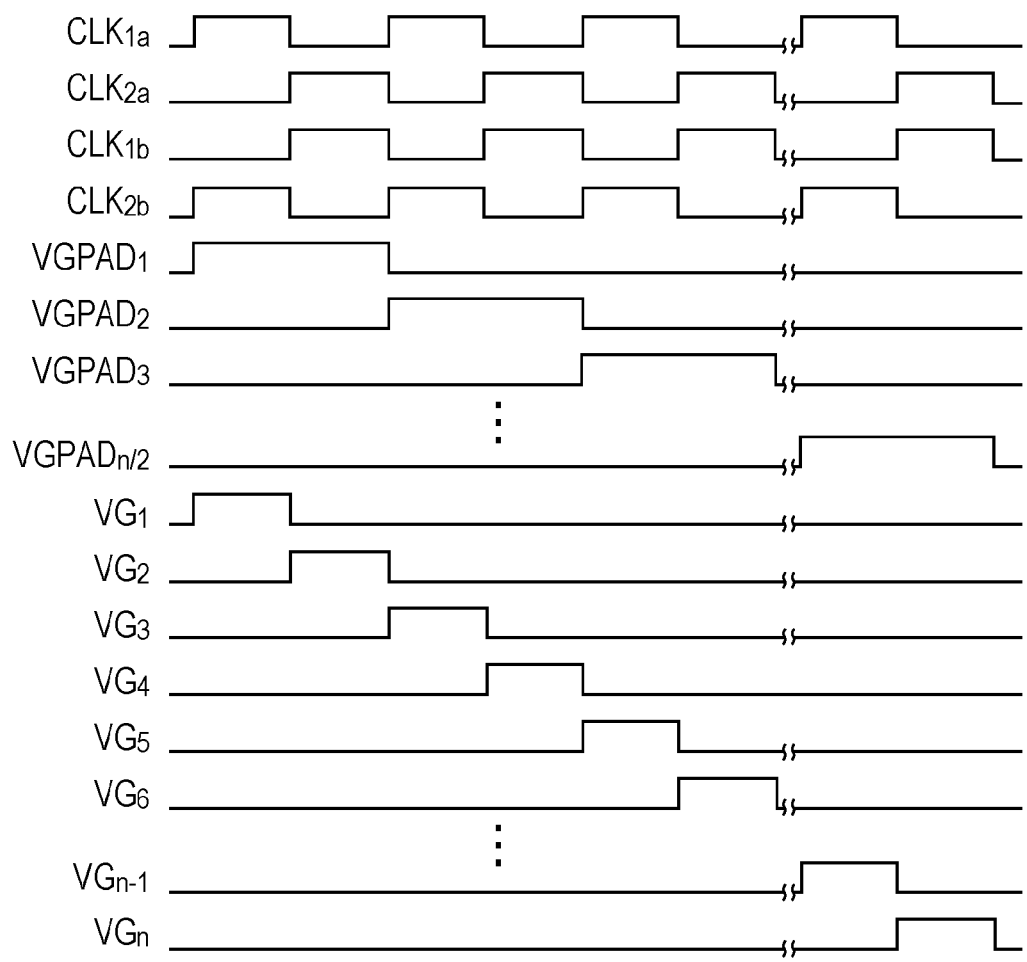
FIG. 1B is a timing chart.

Hereinafter, embodiments will be described in detail with reference to the accompanying drawings. Note that, in the embodiments, radiation includes, in addition to an α ray, a β ray, and a γ ray which are generated by particles (including photons) discharged due to radioactive decay, beams having energies equal to or larger than the α ray, the β ray, and the γ ray such as an X ray, a particle beam, and a cosmic ray.

One disclosed feature of the embodiments may be described as a process which is usually depicted as a flowchart, a flow diagram, a timing diagram, a structure diagram, or a block diagram. Although a flowchart or a timing diagram may describe the operations or events as a sequential process, the operations may be performed, or the events may occur, in parallel or concurrently. In addition, the order of the operations or events may be re-arranged. A process is terminated when its operations are completed. A process may correspond to a method, a program, a procedure, a method of manufacturing or fabrication, a sequence of operations performed by an apparatus, a machine, or a logic circuit, etc. In addition, "a plurality of" may be represented by an integer variable such as M, N, or P. These integer variables may be positive integers larger than 1.

First Embodiment

As shown in FIG. 1A, each of a matrix substrate for a detection device according to a first embodiment and the detection device includes an effective pixel region (pixel array) including a plurality of pixels 101 arranged in a matrix on a support substrate 100. The pixels 101 output electric signals in accordance with radiation or light. Each of the pixels 101 includes a switching element 103 which outputs an electric signal corresponding to a charge generated by a conversion element 102 which converts radiation or light into a charge. Furthermore, each of the pixels 101 includes the conversion element 102 which converts radiation or light into a charge. Here, in this embodiment, the conversion element 102 includes a scintillator which converts a radial ray into a light beam and a photoelectric conversion element which converts the light beam into a charge. However, the embodiment is not limited to this. As the conversion element 102, a direct conversion element which directly converts a radial ray into a charge may be used. Furthermore, an amorphous silicon thin-film transistor (TFT) or a polysilicon thin-film transistor is used as the switching element 103. Although silicon is used as semiconductor material in this embodiment, the embodiment is not limited to this and other semiconductor material such as germanium may be used. More preferably, a stagger polysilicon TFT is used as the switching element 103. The conversion element 102 has a first electrode electrically connected to a first main electrode of the switching element 103 and has a second electrode electrically connected to a bias line 106. The bias line 106 is connected to second electrodes of conversion elements 102 arranged in a row direction in common. A plurality of bias lines 106 arranged in a column direction are connected to one another through a common line 107 and become a common bias line 108 which is electrically connected to an external power source circuit (not shown) through a connection terminal 109. The switching element 103 has a second main electrode electrically connected to a signal line 105. The signal line 105 is connected to second main electrodes of a plurality of switching elements 103 arranged in the row direction in common, and a plurality of signal lines 105 arranged in the column direction are electrically connected to an external read circuit (not shown) through connection terminals 119. The connection terminals 109 and 119 are arranged on the support substrate 100 in a portion between an edge portion of one side of the support substrate 100 and the effective pixel region. A multiplexer 120 is disposed between the connection terminals 119 and the signal lines 105. The multiplexer 120 includes switches 121 which control connections between some of the signal lines 105 (signal lines 105 in odd-numbered columns, for example) and the connection terminals 119 and switches 122 which control connections between the other of the signal lines 105 (signal lines 105 in even-numbered columns, for example) and the connection terminals 119. The switches 121 have control electrodes connected to one another through a control line 123 and are controlled by an external control circuit (not shown) through a connection terminal 125. The switches 122 have control electrodes connected to one another through a control line 124 and are controlled by an external control circuit (not shown) through a connection terminal 126.

Each of the switching elements 103 has a control electrode electrically connected to a corresponding one of driving lines 104. Each of the driving lines 104 is connected to control electrodes of corresponding some of switching elements 103 arranged in the column direction in common, and the driving lines 104 arranged in the row direction are electrically connected to an external driving circuit (not shown) through connection terminals 110. Note that the connection terminals 110 are arranged on the support substrate 100 in a portion between an edge portion of another side which is different from the one side of the support substrate 100 and the effective pixel region. Furthermore, the number of connection terminals 110 is smaller than the number of driving lines 104, that is, smaller than the number of rows of the pixels in the effective pixel region. Then, a demultiplexer 111 is disposed between the connection terminals 110 and the driving lines 104. The demultiplexer 111 includes, between each of the connection terminals 110 and the corresponding two or more driving lines 104, two or more first polycrystalline semiconductor thin-film transistors (TFTs) 112 arranged so as to correspond to the two or more driving lines 104 in a one-to-one manner. Note that, in this embodiment, an element located between each of the connection terminals 110 and the corresponding two or more of the driving lines 104 is referred to as a "unit block" of the demultiplexer 111. Furthermore, in each of unit blocks, an element associated with a driving line 104 corresponding to a first row is referred to as a "first stage", and an element associated with a driving line 104 corresponding to a second row is referred to as a "second stage", and similarly, the following elements are referred to as a "third stage" and a "fourth stage". In this embodiment, each of the unit blocks includes two first polycrystalline semiconductor TFTs 112 such as a polysilicon TFT. The first polycrystalline semiconductor TFTs 112 in each of the unit blocks are used to supply conductive voltages of the switching elements 103 to the corresponding two or more driving lines 104. Each of the first polycrystalline semiconductor TFTs 112 has one main electrode electrically connected to a corresponding one of the corresponding connection terminals 110 and the other main electrode electrically connected to a corresponding one of the driving lines 104. Note that the conductive voltages are used to select pixels and correspond to first voltages of the present invention. Furthermore, first control lines 114a and 114b which supply conductive voltages and nonconductive voltages for the first polycrystalline semiconductor TFTs 112 to control electrodes of the first polycrystalline semiconductor TFTs 112 are provided. In this embodiment, the two first control lines 114a and 114b are disposed, and control signals $CLK_{1a}$ and $CLK_{1b}$ are supplied to the first control lines 114a and 114b through first connection terminals 116a and 116b, respectively. The control electrodes of the first polycrystalline semiconductor TFTs 112 in the first stages included in the unit blocks are electrically connected to the first control line 114a in common. The control electrodes of the first polycrystalline semiconductor TFTs 112 in the second stages included in the unit blocks are electrically connected to the first control line 114b in common. The first control line 114a is electrically connected to the first connection terminal 116a whereas the first control line 114b is electrically connected to the first connection terminal 116b. Note that the demultiplexer 111 of this embodiment may perform a one-to-two demultiplexing operation. However, the embodiment is not limited to this and any demultiplexer may be employed as far as the demultiplexer may perform a one-to-two or more demultiplexing operation. Note that, as the external circuits connected to the connection terminals, integrated circuits are preferably used. When integrated circuits are used, the various circuits may be disposed on respective integrated circuits or some of the circuits or all the circuits may be disposed on a single integrated circuit.

Each of the unit blocks of the demultiplexer 111 further includes the following two elements. First, each of the unit blocks includes a plurality of second polycrystalline semiconductor thin-film transistors (TFTs) 113 arranged between a corresponding one of the connection terminals 110 and corresponding two or more of the driving lines 104 so that the second polycrystalline semiconductor TFTs 113 correspond to the two or more driving lines 104 in a one-to-one manner. The second polycrystalline semiconductor TFTs 113 maintain the two or more driving lines 104 to have nonconductive voltages of the switching elements 103. Note that the nonconductive voltages cause the pixels to be non-selection states and correspond to second voltages. Specifically, each of the second polycrystalline semiconductor TFTs 113 maintain the two or more driving lines 104 to have the non-selection voltages so that pixels connected to the two or more driving lines 104 are maintained to be non-selection states. Each of the second polycrystalline semiconductor TFTs 113 has one main electrode electrically connected to a corresponding one of the driving lines 104 and has the other main electrode electrically connected to a node to which nonconductive voltages (Voff) of corresponding some for the switching elements 103 are to be supplied from an external power supply circuit (not shown) through a connection terminal 118. In this embodiment, each of the unit blocks includes two second polycrystalline semiconductor TFTs 113. The second polycrystalline semiconductor TFTs 113 supply the nonconductive voltages for the switching elements 103 to the two or more driving lines 104. One of the two main electrodes of each of the second polycrystalline semiconductor TFTs 113 is electrically connected to the connection terminal 118 used to supply the nonconductive voltages (Voff) for the switching elements 103 and the other of the two main electrodes is electrically connected to a corresponding one of the driving lines 104. Next, each of the unit blocks includes second control lines 115a and 115b which supply conductive voltages and nonconductive voltages for the second polycrystalline semiconductor TFTs 113 to control electrodes of the second polycrystalline semiconductor TFTs 113. In this embodiment, the two second control lines 115a and 115b are disposed which are electrically connected to nodes to which control signals $CLK_{2a}$ and $CLK_{2b}$ are supplied from an external control circuit (not shown) through second connection terminals 117a and 117b, respectively. The control electrodes of the second polycrystalline semiconductor TFTs 113 in the first stages included in the unit blocks are electrically connected to the second control line 115a in common. The control electrodes of the second polycrystalline semiconductor TFTs 113 in the second stages included in the unit blocks are electrically connected to the second control line 115b in common. The second control line 115a is electrically connected to the second connection terminal 117a whereas the second control line 115b is electrically connected to the second connection terminal 117b.

Next, an operation of the demultiplexer 111 according to the embodiment will be described with reference to FIGS. 1A and 1B. Here, in FIG. 1B, a control signal supplied to one of the connection terminals 110 corresponding to the driving lines 104 in the first and second rows is denoted by $VGPAD_1$, and a control signal supplied to one of the connection terminals 110 corresponding to the driving lines 104 in the third and fourth rows is denoted by $VGPAD_2$. The same is true for the following rows and a control signal supplied to one of the connection terminals 110 corresponding to the driving lines 104 in the (n−1)th and nth rows is denoted by $VGPAD_{n/2}$. Furthermore, a control signal supplied to the first connection terminal 116a is denoted by $CLK_{1a}$, a control signal supplied to the second connection terminal 117a is denoted by $CLK_{2a}$, a control signal supplied to the first connection terminal 116b is denoted by $CLK_{1b}$, and a control signal supplied to the second connection terminal 117b is denoted by $CLK_{2b}$. Furthermore, voltages of the driving lines 104 in the first to nth rows are denoted by $VG_1$ to $VG_n$.

First, the control signal $VGPAD_1$ has a voltage (hereinafter referred to as a "voltage Vcom") larger than the conductive voltages of the switching elements 103 and the control signal $VGPAD_2$ to $VGPAD_{n/2}$ have the nonconductive voltages (hereinafter referred to as "nonconductive voltages Voff") of the switching elements 103. In this case, the control signals $CLK_{1a}$ and $CLK_{2b}$ correspond to conductive voltages (hereinafter referred to as "high levels") of the first polycrystalline semiconductor TFTs 112 and the second polycrystalline semiconductor TFTs 113. On the other hand, the control signal $CLK_{1b}$ and $CLK_{2a}$ have nonconductive voltages (hereinafter referred to as "low levels") of the first polycrystalline semiconductor TFTs 112 and the second polycrystalline semiconductor TFTs 113. By this, the voltage $VG_1$ corresponding to the driving lines 104 in the first row which is a predetermined driving line becomes the conductive voltages (hereinafter referred to as a "conductive voltages Von") of the switching elements 103 and the voltages $VG_2$ to $VG_n$ corresponding to the other driving lines 104 become the nonconductive voltages Voff. Next, while the control signal $VGPAD_1$ remains to have the voltage Vcom and the control signals $VGPAD_2$ to $VGPAD_{n/2}$ remain to have the nonconductive voltages Voff, the control signals $CLK_{1a}$ and $CLK_{2b}$ become the low levels and the control signal $CLK_{1b}$ and $CLK_{2a}$ become the high levels. Accordingly, the voltage $VG_2$ becomes the conductive voltage Von and the voltage $VG_1$ and the voltages $VG_3$ to $VG_n$ become the nonconductive voltages Voff. This operation corresponds to a demultiplexing operation performed by the demultiplexer 111 using the first unit block.

Next, while the control signal $VGPAD_2$ has the voltage Vcom and the control signals $VGPAD_1$ and the control signals $VGPAD_3$ to $VGPAD_{n/2}$ have the nonconductive voltages Voff, the control signals $CLK_{1a}$ and $CLK_{2b}$ are brought to the high levels and the control signal $CLK_{1b}$ and $CLK_{2a}$ are brought to the low levels. Accordingly, the voltage $VG_3$ becomes the conductive voltage Von and the voltages $VG_1$ and $VG_2$ and the voltages $VG_4$ to $VG_n$ correspond to the nonconductive voltages Voff. Next, while the control signal $VGPAD_2$ remains to have the voltage Vcom and the control signal $VGPAD_1$ and the control signals $VGPAD_3$ to $VGPAD_{n/2}$ remain to have the nonconductive voltages Voff, the control signals $CLK_{1a}$ and $CLK_{2b}$ are brought to the low levels and the control signal $CLK_{1b}$ and $CLK_{2a}$ are brought to the high levels. Accordingly, the voltage $VG_4$ becomes the conductive voltage Von and the voltages $VG_1$ to $VG_3$ and the voltages $VG_5$ to $VG_n$ correspond to the nonconductive voltages Voff. This operation corresponds to the demultiplexing operation performed by the demultiplexer 111 using the second unit block. The same operation is sequentially performed on the following unit blocks until the multiplexing operation performed on the n/2-th unit block of the demultiplexer 111 is terminated so that the switching elements 103 are sequentially scanned on a row-by-row basis.

As described above, in the embodiment, use of the demultiplexer 111 suppresses the number of connection terminals 110 connected to the external driving circuit to 1/(the number of unit blocks) at most. Note that, as all the number of connection terminals, the number of first connection terminals 116a and 116b and the second connection terminals 117a and 117b for the elements included in the unit blocks and the number of connection terminals 118 to which the nonconductive voltages of the switching elements 103 are supplied are added. Furthermore, to maintain the driving lines 104 having the nonconductive voltages of the switching elements 103, the second polycrystalline semiconductor TFTs 113 in which the conductive states and the nonconductive states are controlled by control signals supplied to the second control lines 115a and 115b are used. By this, to the switching elements 103, the conductive voltages are supplied through the first polycrystalline semiconductor TFTs 112 in the conductive states or the nonconductive voltages are supplied through the first polycrystalline semiconductor TFTs 112 in the conductive states or the second polycrystalline semiconductor TFTs 113 in the conductive states. In particular, it is necessarily the case that the second polycrystalline semiconductor TFTs 113 are constantly in the conductive states since the nonconductive voltages are supplied to the second polycrystalline semiconductor TFTs 113. Therefore, unlike general techniques, the nonconductive voltages are not constantly supplied to the driving lines 104 through the second polycrystalline semiconductor TFTs 113 being in the conductive states serving as resistors. Accordingly, even when the nodes are affected by signal lines which intersect with lines to which the nonconductive voltages (Voff) of the driving lines 104 which are adjacent to each other and the switching elements 103 are supplied, the driving lines 104 are prevented from being affected by the affected nodes. Since the second polycrystalline semiconductors TFTs 113 do not constantly receive the conductive voltages, high reliability is ensured. Accordingly, a matrix substrate and a detection device which use high-speed polycrystalline semiconductor TFTs and which are capable of obtaining a high-quality image at high speed and with high reliability may be provided while the number of external gate terminals is suppressed by the demultiplexer 111. Note that, in this embodiment, the nonconductive voltages Voff are supplied to the control signals $VGPAD_1$ to $VGPAD_{n/2}$. However, this does not mean that voltages the same as the nonconductive voltages Voff supplied through the second polycrystalline semiconductor TFTs 113 should be supplied to the control signals VGPAD1 to VGPADn/2. Voltages equal to or smaller than a threshold value of the switching elements 103 functioning as the nonconductive voltages of the switching elements 103 should be supplied to the driving lines 104, and voltages supplied to the control signals $VGPAD_1$ to $VGPAD_{n/2}$ which are different from the voltage Vcom should correspond to such voltages.

Next, a sectional configuration of each of the pixels 101 will be described with reference to FIG. 2A. In each of the pixels 101 according to this embodiment, the conversion element 102 and the switching element 103 face to each other on a one-to-one basis. The switching element 103 includes a first semiconductor layer 201, a first extrinsic semiconductor layer 202, a first insulation layer 203, a first conductive layer 204, a second insulation layer 205, and a second conductive layer 206 which are disposed on the support substrate 100, such as a glass substrate, having an insulation surface. The first semiconductor layer 201 functions as a TFT channel region, the first extrinsic semiconductor layer 202 functions as a source region or a drain region, the first insulation layer 203 functions as a gate insulation film, the first conductive layer 204 functions as a gate electrode, and the second conductive layer 206 functions as a source electrode or a drain electrode. Here, the gate electrode corresponds to the control electrodes described above with reference to FIGS. 1A and 1B, and the source electrode or the drain electrode corresponds to the main electrodes. Note that, in FIGS. 2A and 2B, a polysilicon stagger TFT is used as the first semiconductor layer 201. Accordingly, the first semiconductor layer 201 has a layer configuration the same as those of the first polycrystalline semiconductor TFTs 112 and the second polycrystalline semiconductor TFTs 113, and a simple processing step is attained. Then, the conversion element 102 is arranged on a third insulation layer 207 which covers the switching element 103. A photoelectric conversion element constituting the conversion element 102 includes a fourth conductive layer 209, a second extrinsic semiconductor layer 210, a second semiconductor layer 211, a third extrinsic semiconductor layer 212, a fifth conductive layer 213, and a sixth conductive layer 214. The fourth conductive layer 209 is electrically connected to the second conductive layer 206 serving as the first main electrode of the switching element 103 through a third conductive layer 208, and functions as a first electrode. P-type impurity is injected into the second extrinsic semiconductor layer 210 and n-type impurity is injected into the third extrinsic semiconductor layer 212. The second semiconductor layer 211 functions as a photoelectric conversion layer of the photoelectric conversion element, the fifth conductive layer 213 functions as the bias line 106, and the sixth conductive layer 214 functions as a second electrode. Then, a scintillator 216 is disposed on a fourth insulation layer 215 functioning as a flattening layer which covers a plurality of photoelectric conversion elements. The conversion element 102 and the switching element 103 are appropriately formed using a general vapor phase epitaxial method (vapor deposition method), an etching technique, or a photolithography technique. Note that, although a PIN photodiode using the second extrinsic semiconductor layer 210 is taken as an example of a photoelectric conversion element in this embodiment, the embodiment is not limited to this and an MIS photosensor using an insulation layer instead of the second extrinsic semiconductor layer 210 may be employed.

Figure 2A:
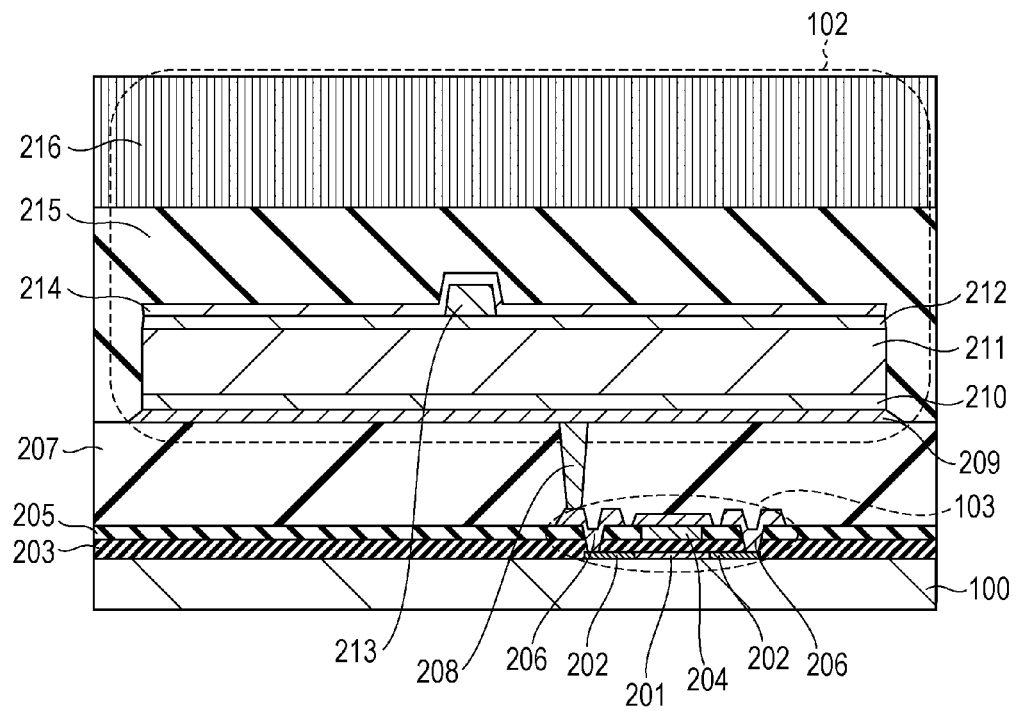
FIG. 2A is a sectional view illustrating a pixel of the detection device and the matrix substrate according to the first embodiment.
Figure 2B:
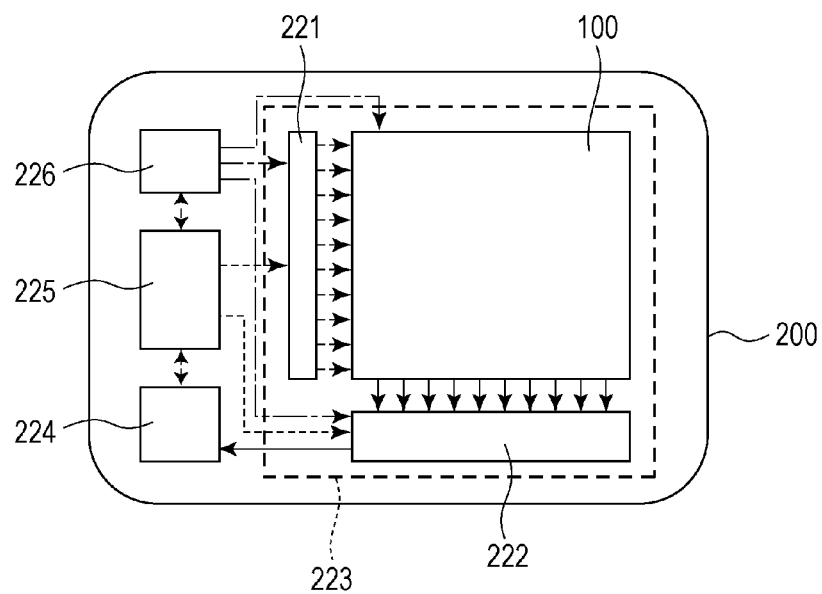
FIG. 2B is a concept diagram illustrating the detection device according to the first embodiment.

Next, a configuration of the detection device according to one embodiment will be described with reference to FIG. 2B. A detection device 200 includes the support substrate 100 at least having the pixel array, the demultiplexer 111, and the connection terminals 110. The detection device 200 includes a detection unit 223 having the support substrate 100, a driving circuit 221 which drives the pixel array, and a reading circuit 222 which outputs an electric signal output from the pixel array as image data. The driving circuit 221 is electrically connected to the connection terminals 110 and outputs the voltage Vcom and the nonconductive voltages Voff. Specifically, the second semiconductor layer 211 controls selection states and non-selection states of the pixels so as to drive the pixels. The reading circuit 222 is electrically connected to the connection terminals 119. The detection device 200 further includes a signal processor 224 which processes and outputs the image data supplied from the detection unit 223, a control circuit 225 which controls an operation of the detection unit 223 by supplying control signals to the components, and a power supply circuit 226 which supplies biases to the components. The signal processor 224 receives a control signal from a control computer (not shown) and supplies the control signal to the control circuit 225. Furthermore, the signal processor 224 receives information on potentials of the signal lines 105 from the reading circuit 222 during irradiation and supplies the information to the control computer (not shown). The power supply circuit 226 incorporates a regulator which receives voltages from an external power source, not shown, or an incorporated battery and supplies voltages required in the pixel array, the driving circuit 221, and the reading circuit 222. The power supply circuit 226 is electrically connected to the connection terminals 109 and 118. The control circuit 225 is electrically connected to the first connection terminals 116a and 116b and the second connection terminals 117a and 117b and outputs the control signals $CLK_{1a}$ to $CLK_{2b}$. Furthermore, the control circuit 225 is electrically connected to the connection terminal 125. Note that, although each of the driving circuit 221, the reading circuit 222, the signal processor 224, the control circuit 225, and the power supply circuit 226 are shown as a block, this does not means that each of them is configured as a single integrated circuit. Each of them may be configured by a plurality of integrated circuits, and alternatively, all of them may be disposed on a single integrated circuit. Furthermore, it is apparent that the description described above is appropriately applicable to other embodiments.

Second Embodiment

Figure 3A:
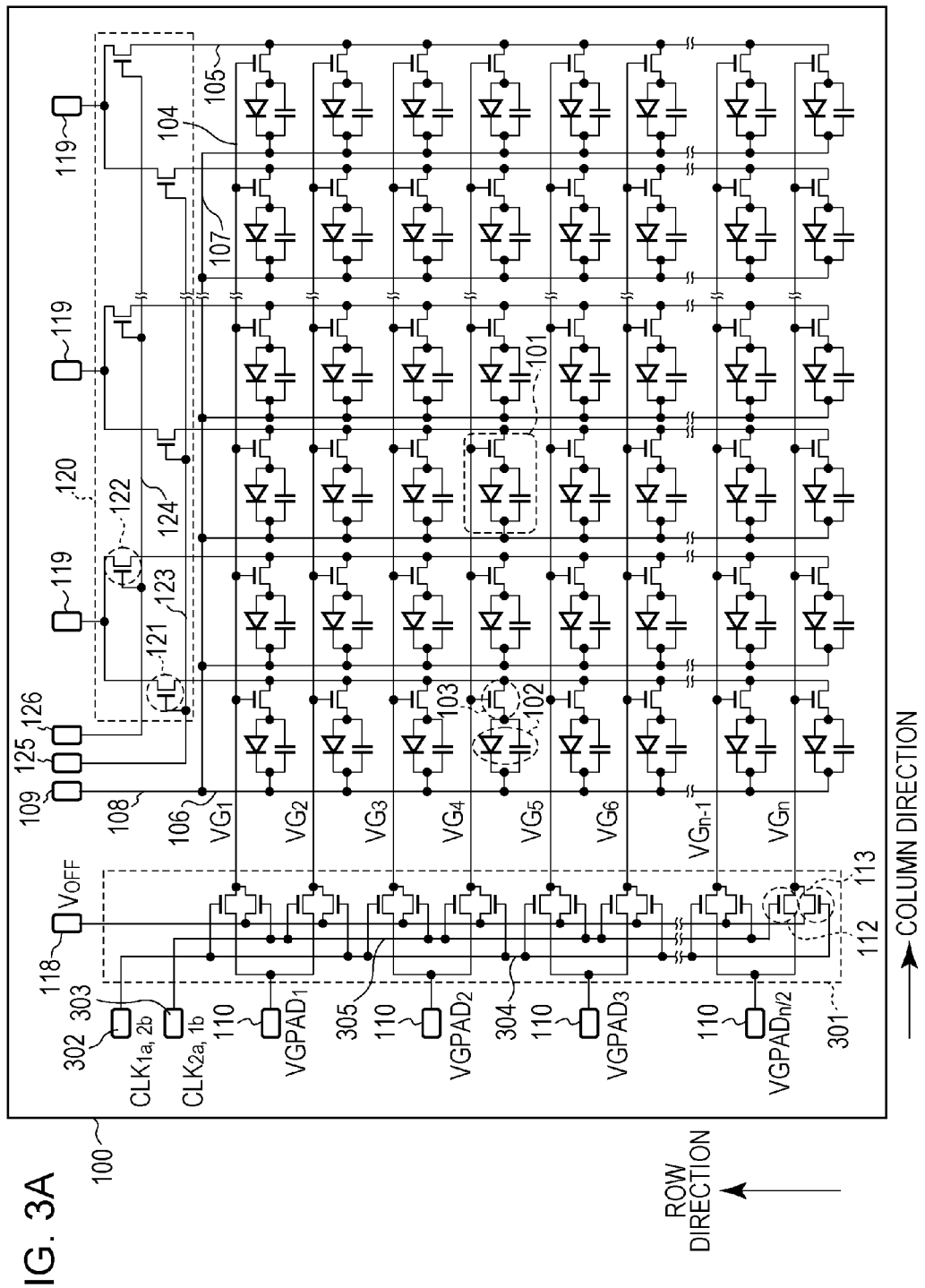
FIG. 3A is an equivalent circuit diagram of a detection device and a matrix substrate according to a second embodiment.

Next, a second embodiment will be described with reference to FIGS. 3A and 3B. Note that only portions different from the first embodiment are described in detail hereinafter, and components the same as those of the first embodiment are denoted by the same reference numerals and detailed descriptions thereof are omitted.

As shown in FIG. 1B, the control signal $CLK_{1a}$ supplied to the first control line 114a and the control signal $CLK_{2b}$ supplied to the second control line 115b has the same phase. Furthermore, the control signal $CLK_{1b}$ supplied to the first control line 114b and the control signal $CLK_{2a}$ supplied to the second control line 115a has the same phase. Therefore, as shown in FIG. 3A, in this embodiment, the first connection terminal 116a and the second connection terminal 117b are integrated as a control terminal 302, and the first connection terminal 116b and the second connection terminal 117a are integrated as a control terminal 303. Furthermore, the first control line 114a and the second control line 115b to which signals having the same phase are supplied are integrated as a control line 304, and the first control line 114b and the second control line 115a are integrated as a control line 305.

By this, the number of control terminals 302 and the number of control terminals 303 which are connected to elements included in a demultiplexer 301 may be reduced to half when compared with the first embodiment. Accordingly, the number of connection terminals may be further reduced in an entire matrix substrate for the detection device when compared with the first embodiment.

Figure 3B:
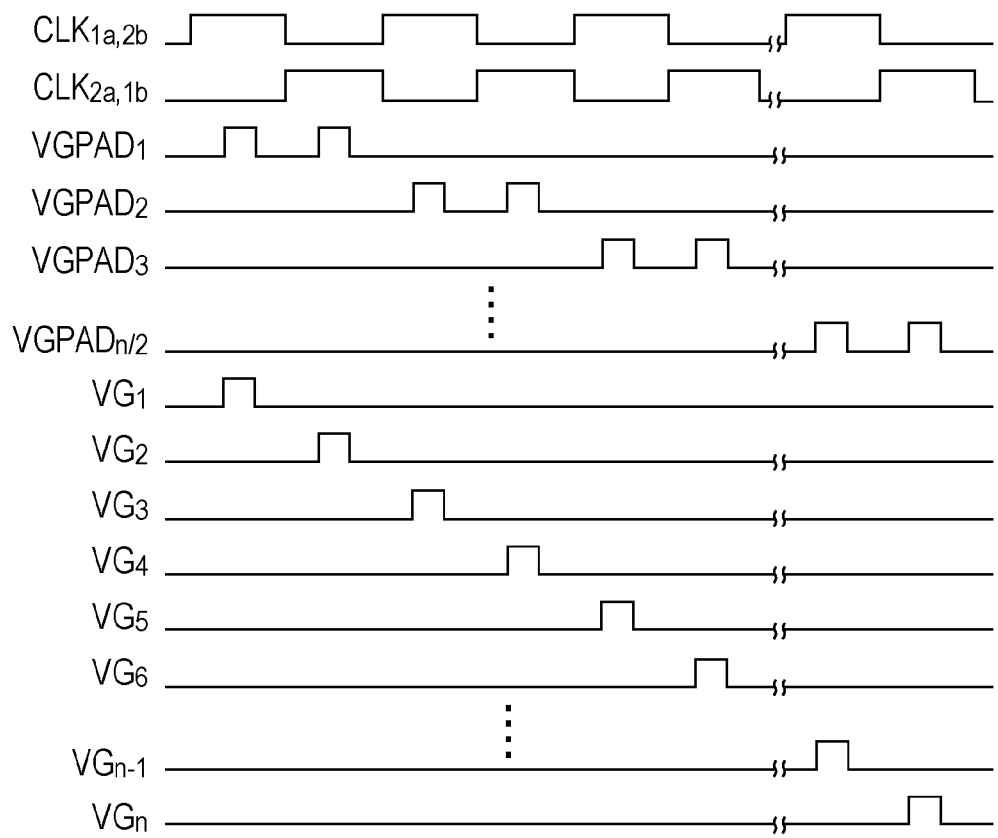
FIG. 3B is a timing chart.

Moreover, as shown in FIG. 3B, an external driving circuit (not shown) is set so that a period of time in which a voltage Vcom is supplied to the control signal $VGPAD_1$ to $VGPAD_{n/2}$ is set to be shorter than a period of time in which the control signals $CLK_{1a}$, $CLK_{2b}$, $CLK_{2a}$, and $CLK_{1b}$ are high levels and the voltage Vcom is consecutively supplied to each of the connection terminals 110 twice. By this, after a voltage supplied to a driving line 104 in a certain row is fixed to a nonconductive voltage Voff, a voltage supplied to another driving line 104 in another row is set to a conductive voltage Von. Therefore, influence by voltages supplied to the other driving lines 104 is reduced when compared with the first embodiment. Note that this is similarly applicable to the first embodiment.

Third Embodiment

Note that, although the control terminals to which control signals having the same phase are supplied are integrated and the control lines to which the same control signal is supplied are integrated, the embodiment is not limited to this and any configuration may be employed as long as connection terminals may be shared. A third embodiment will be described with reference to FIG. 4. Note that only portions different from the first embodiment are described in detail hereinafter, and components the same as those of the first embodiment are denoted by the same reference numerals and detailed descriptions thereof are omitted.

Figure 4:
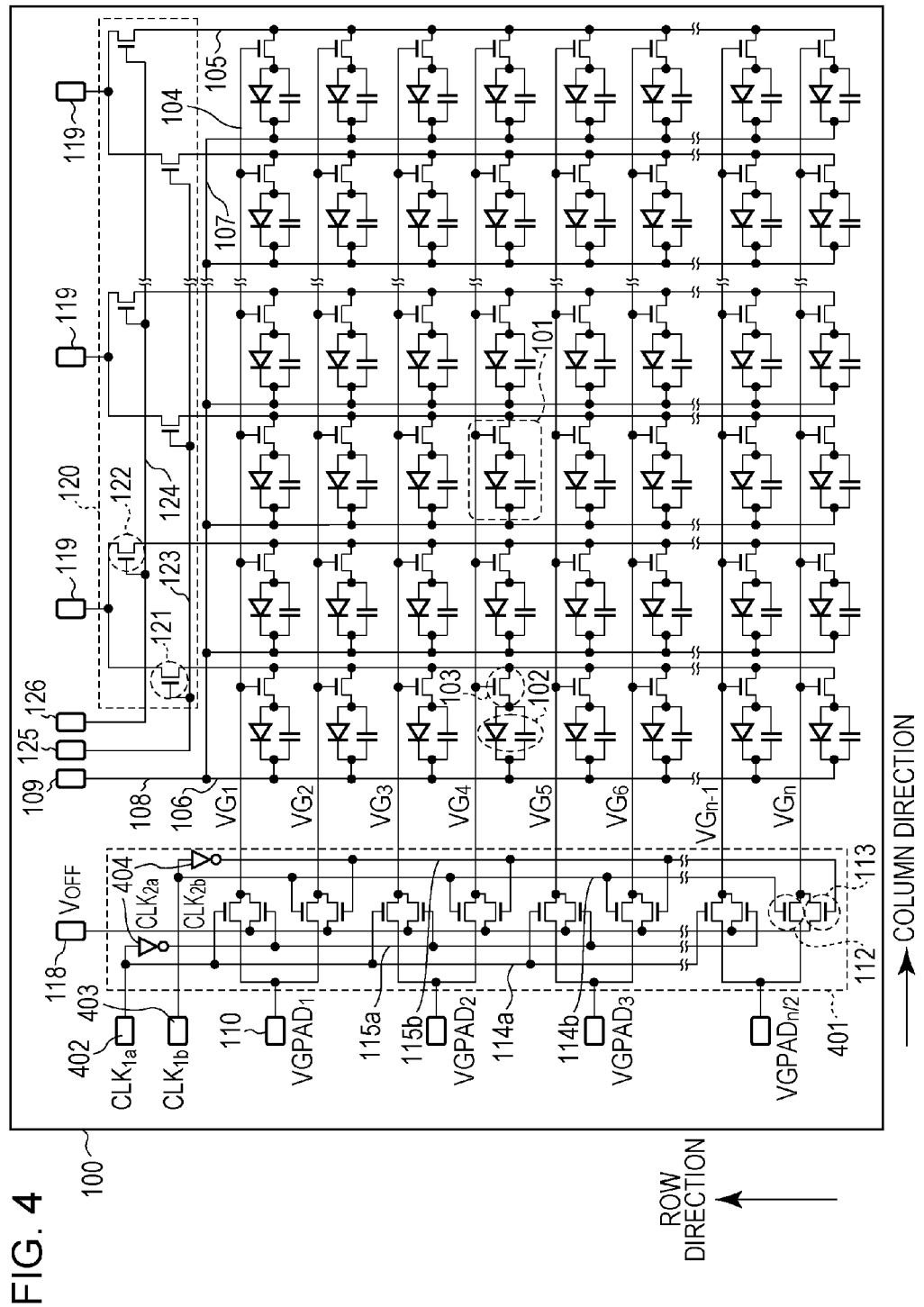
FIG. 4 is an equivalent circuit diagram of a detection device and a matrix substrate according to a third embodiment.

As shown in FIG. 1B, the control signal $CLK_{1a}$ supplied to a first control line 114a and the control signal $CLK_{1b}$ supplied to a second control line 114b have different phases. Furthermore, the control signal $CLK_{2a}$ supplied to the second control line 115a and the control signal $CLK_{2b}$ supplied to the second control line 115b have opposite phases. Therefore, in this embodiment, as shown in FIG. 4, the first connection terminal 116a and the first connection terminal 116b are integrated as a connection terminal 402, and the second connection terminal 117a and the second connection terminal 117b are integrated as a connection terminal 403. The control signal $CLK_{1a}$ shown in FIG. 1B is supplied to the connection terminal 402 and the control signal $CLK_{1b}$ shown in FIG. 1B is supplied to the connection terminal 403. Furthermore, inverters 404 used to reverse phases of control signals are disposed between the connection terminal 402 and the first control line 115a and between the connection terminal 403 and the second control line 115b.

By this, the number of control terminals 402 and the number of control terminals 403 which are connected to elements included in a demultiplexer 401 may be reduced to half when compared with the first embodiment. Accordingly, the number of connection terminals is further reduced as an entire matrix substrate when compared with the first embodiment.

Fourth Embodiment

Next, a fourth embodiment will be described with reference to FIGS. 5A and 5B. Note that only portions different from the first to third embodiments are described in detail hereinafter, and components the same as those of the first to third embodiments are denoted by the same reference numerals and detailed descriptions thereof are omitted.

Figure 5A:
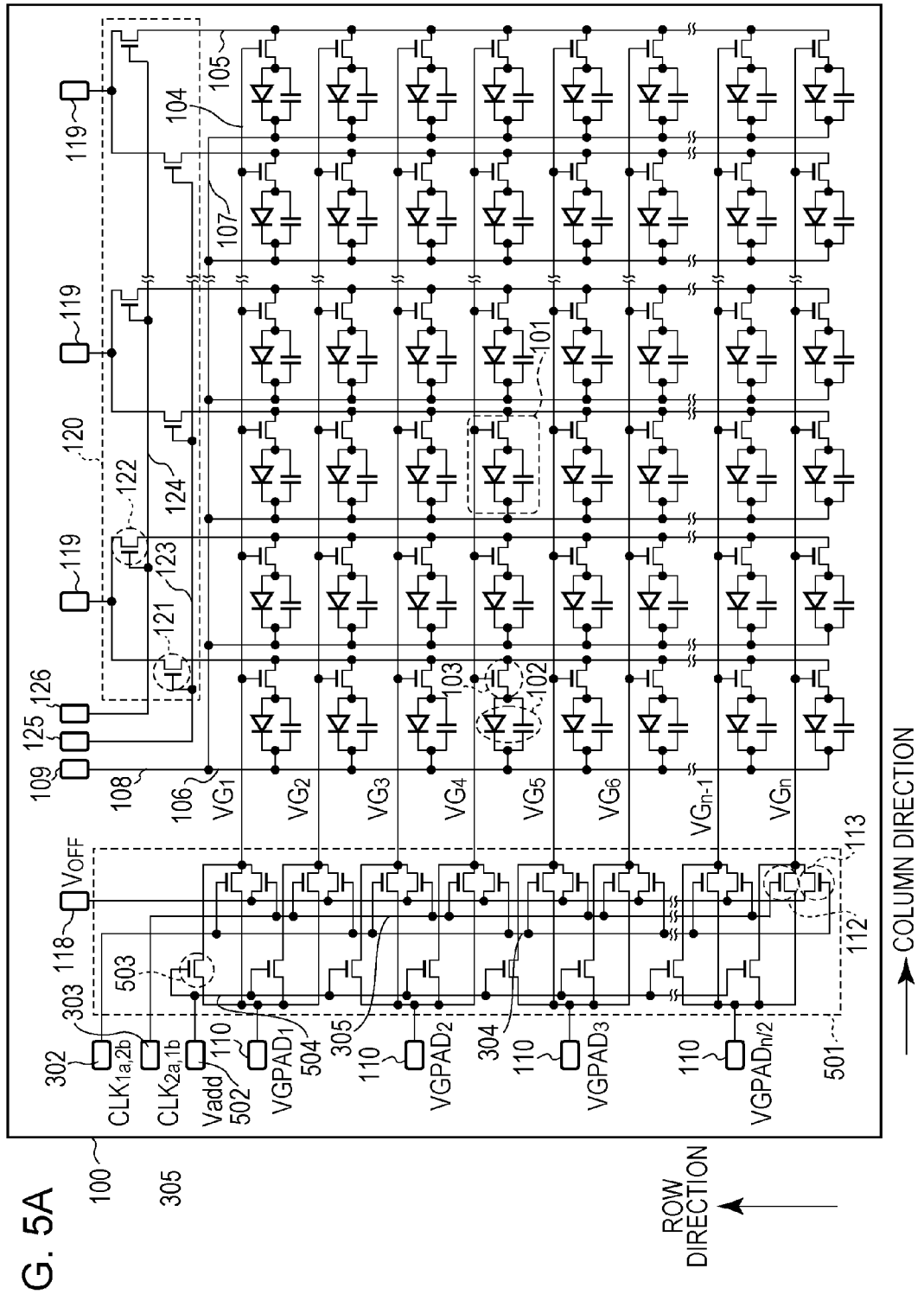
FIG. 5A is an equivalent circuit diagram of a detection device and a matrix substrate according to a fourth embodiment.

As shown in FIG. 5A, in this embodiment, components described below are added to the configurations according to the first to third embodiments. First, a connection terminal 502 which supplies a control signal Vadd which is brought to a high level in an addition mode is disposed on a support substrate 100. The control signal Vadd is supplied from an external control circuit (not shown). Second, a demultiplexer 501 includes third polycrystalline semiconductor thin-film transistors (TFTs) 503 between connection terminals 110 and driving lines 104. The third polycrystalline semiconductor TFTs 503 correspond to the driving lines 104 and are arranged in parallel to first polycrystalline semiconductor TFTs 112. Third, the demultiplexer 501 includes a control line 504 which electrically connects control electrodes of the third polycrystalline semiconductor TFTs 503 and the connection terminal 502 to each other. Since the demultiplexer 501 is configured as described above, the addition mode is provided and electric signals output from pixels in a plurality of rows may be subjected to averaging in signal lines 105 in the addition mode.

Figure 5B:
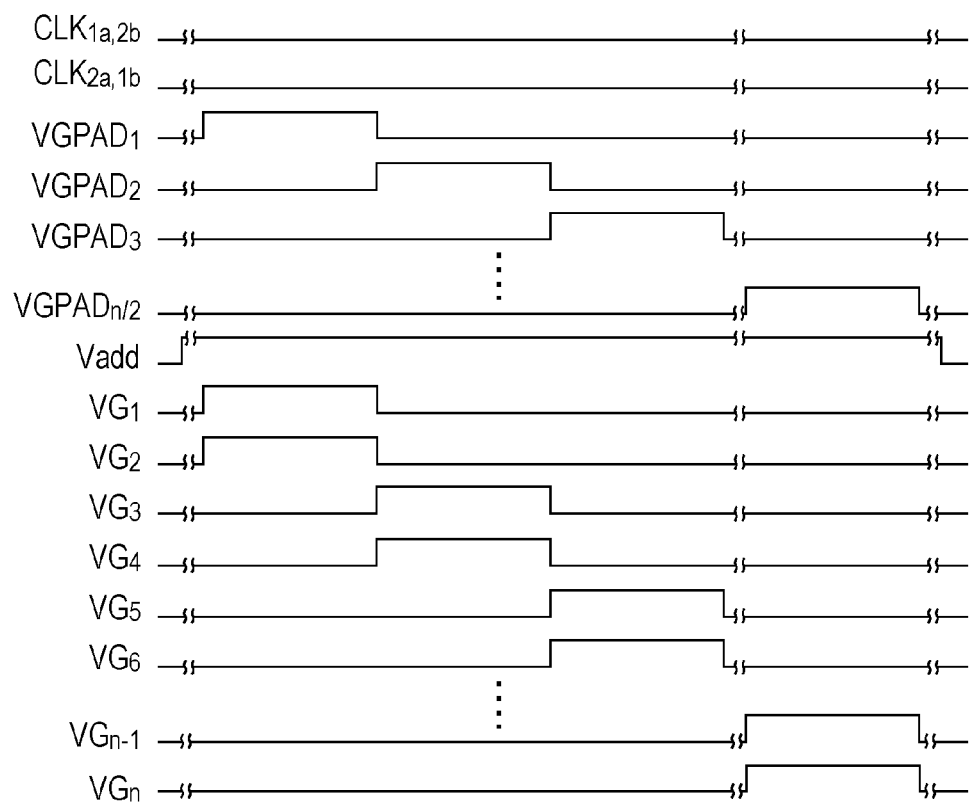
FIG. 5B is a timing chart.

As shown in FIG. 5B, in the addition mode, the control signal Vadd is maintained in the high level and the control signal $CLK_{1a}$ to $CLK_{2b}$ are maintained in low levels. Accordingly, the first polycrystalline semiconductor TFTs 112 and second polysilicon TFTs 113 are maintained in nonconductive states and the third polycrystalline semiconductor TFTs 503 are maintained in conductive states. Consequently, since control signals $VGPAD_1$ to $VGPAD_{n/2}$ are supplied to the driving lines 104 through the third polycrystalline semiconductor TFTs 503, conductive voltages Von are simultaneously supplied to the driving lines 104 in a unit of two rows in accordance with the control signals $VGPAD_1$ to $VGPAD_{n/2}$. Note that, in a non-addition mode (normal mode) of this embodiment, one of the first to third embodiments is employed, and therefore, a detailed description thereof is omitted.

According to this embodiment, in addition to the first to third embodiments, a matrix substrate for a detection device and the detection device capable of operating in the addition mode and the non-addition mode may be provided.

Fifth Embodiment

Figure 6A:
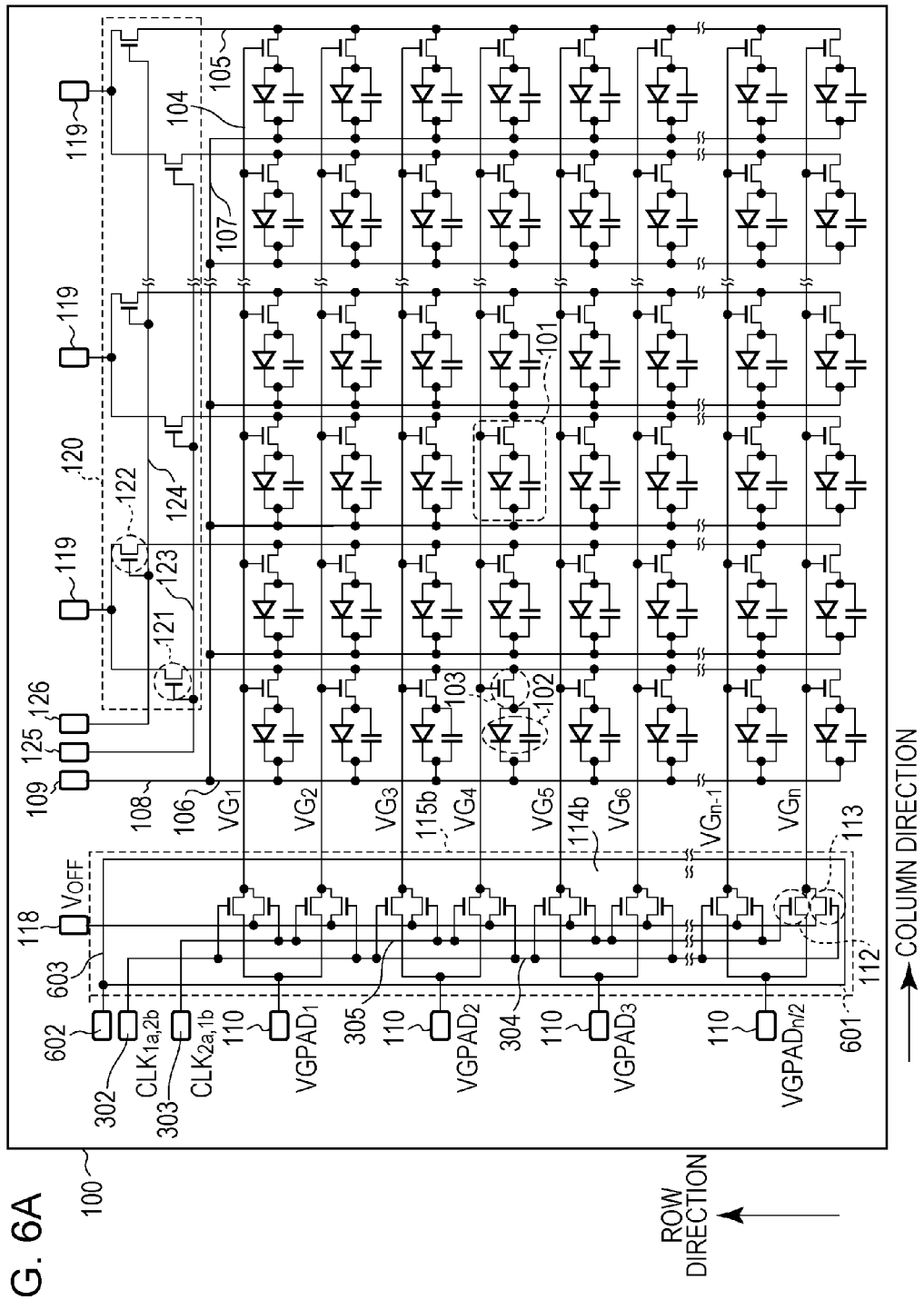
FIG. 6A is an equivalent circuit diagram of a detection device and a matrix substrate according to a fifth embodiment.
Figure 6B:
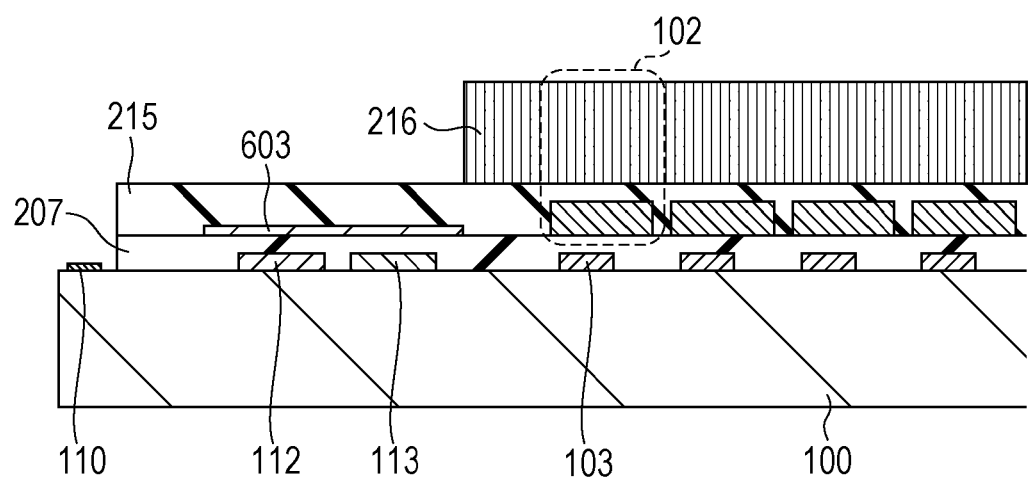
FIG. 6B is a schematic sectional view.

Next, a fifth embodiment will be described with reference to FIGS. 6A and 6B. Note that only portions different from the first to fourth embodiments are described in detail hereinafter, and components the same as those of the first to fourth embodiments are denoted by the same reference numerals and detailed descriptions thereof are omitted.

In a demultiplexer according to the embodiment, polycrystalline TFTs should have low resistances with a high-speed operation. Therefore, sizes of the polycrystalline semiconductor TFTs become large and TFTs having large sizes are arranged adjacent to pixels in a first row in an effective pixel region. Therefore, the demultiplexer may affect pixels near the demultiplexer due to operation of the demultiplexer. Specifically, in the pixel configuration in which the conversion elements 102 are disposed over the switching elements 103 as shown in FIG. 2A, the fourth conductive layer 209 serving as first electrodes of the conversion elements 102 is likely to be affected. Therefore, in this embodiment, the following components are added as shown in FIG. 6A. First, a connection terminal 602 to which a fixed potential is supplied is disposed on a support substrate 100. The fixed potential is supplied from an external power supply circuit (not shown), for example. Second, a demultiplexer 601 includes a shield portion 603 which covers at least a plurality of first polycrystalline semiconductor TFTs 112 and a plurality of second polycrystalline semiconductor TFTs 113 from above. As shown in a sectional view shown in FIG. 6B, the shield portion 603 is disposed on the first polycrystalline semiconductor TFTs 112 and the second polycrystalline semiconductor TFTs 113. As the shield portion 603, the fourth conductive layer 209 serving as the first electrodes of the conversion element 102 and a second semiconductor layer 211 are suitably used. Since the demultiplexer 601 is configured as described above, the operation of the demultiplexer less affects pixels located in the vicinity of the demultiplexer.

Sixth Embodiment

Figure 7:
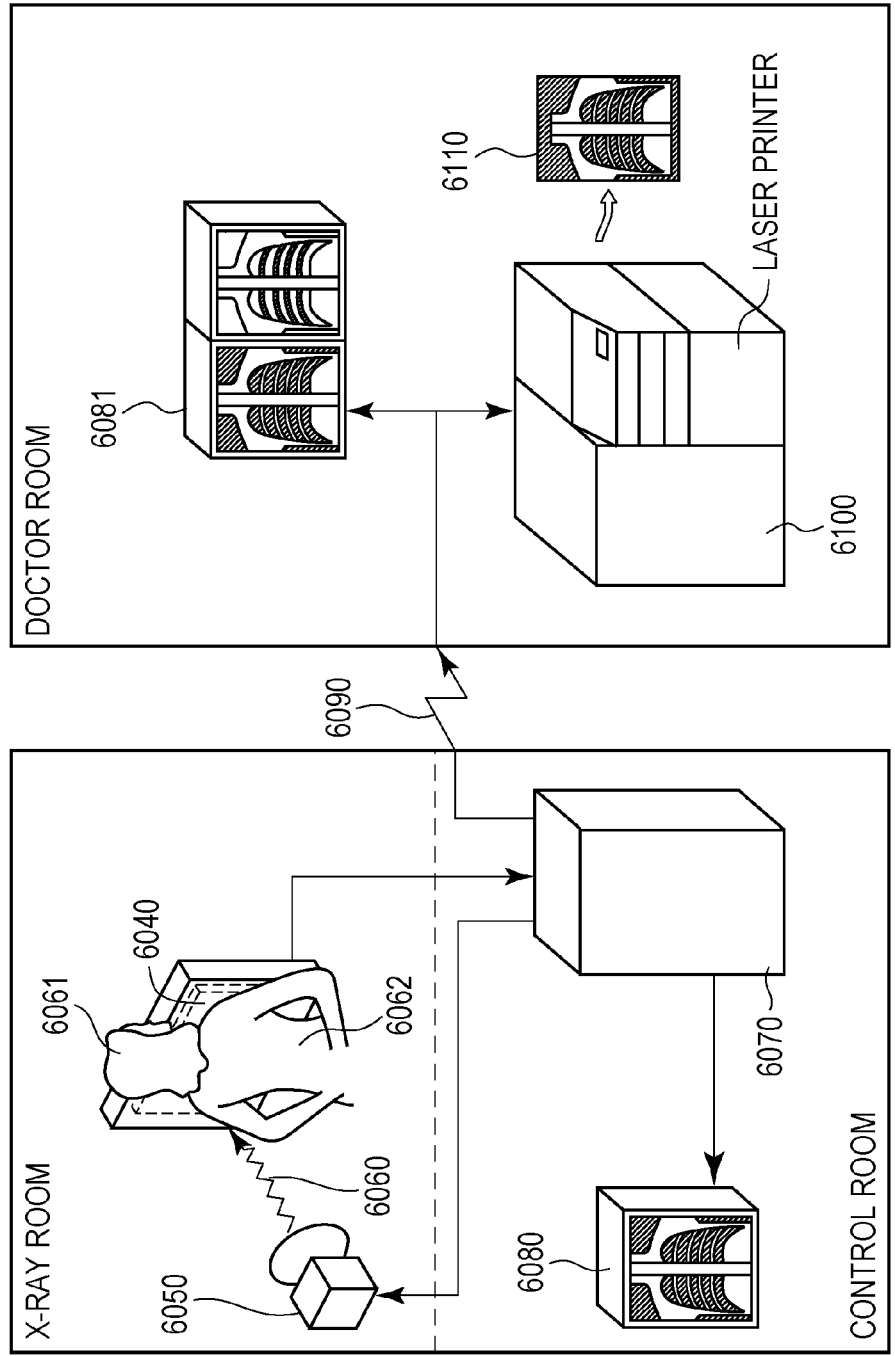
FIG. 7 is a concept diagram illustrating application of the detection device according to a sixth embodiment to a detection system.

An example of application to a radiation detection system using a radiation detection device according to the embodiments will be described with reference to FIG. 7.

An x-ray 6060 generated by an x-ray tube 6050 which is a radiation source is transmitted through a chest portion 6062 of an examinee 6061 and encounters a detection device 6040 of this embodiment. The encountered x-ray includes information on the inside of a body of the examinee 6061. A scintillator 216 emits light in response to irradiation of the x-ray and resultant light is subjected to photoelectric conversion using a photoelectric conversion element so as to obtain electric information. This information may be converted into digital information and is observed by a display 6080 serving as a display unit installed in a control room after being subjected to an image process by an image processor 6070 serving as a signal processing unit.

Furthermore, this information may be transmitted to a remote location by a transmission processing unit such as a telephone line 6090, may be displayed in a display 6081 serving as a display unit installed in another location such as a doctor room, and may be stored in a recording unit such as an optical disc so that a doctor in the remote location may make a diagnosis. Furthermore, the information may be recorded in a film 6110 serving as a recording medium by a film processor 6100 serving as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-281057 filed Dec. 16, 2010, which is hereby incorporated by reference herein in its entirety.

What is claimed is:

1. A matrix substrate for a detection device comprising:
a plurality of pixels arranged in a matrix, wherein each of the plurality of pixels includes a conversion element for converting radial rays or light beams into charges and a thin-film transistor for outputting electric signals corresponding to charges generated by the conversion elements, the conversion element has a first electrode, a second electrode, and a semiconductor layer arranged between the first electrode and the second electrode, the thin-film transistor has a gate electrode, a source electrode, and a drain electrode, and one of the source electrode and the drain electrode is connected to the first electrode;
a plurality of driving lines which are arranged in the column direction and each of which is connected to the gate electrode and connected to a number of the pixels in a row direction in common;
a plurality of connection terminals configured to connect a driving circuit which drives the pixels and the driving lines with each other and the number of which is smaller than the number of driving lines; and
a demultiplexer configured to include a plurality of first polycrystalline semiconductor thin-film transistors and a first control line, wherein the plurality of first polycrystalline semiconductor thin-film transistors is arranged between the connection terminals and the driving lines and corresponds to the driving lines in a one-to-one manner, each of the first polycrystalline semiconductor thin-film transistors is configured to supply a first voltages which brings the respective connected pixels into a respective selection states to the driving lines, and wherein the first control line is configured to supply a first control signal which has a conductive voltage of the first polycrystalline semiconductor thin-film transistors and a nonconductive voltage of the first polycrystalline semiconductor thin-film transistors to control electrodes of the first polycrystalline semiconductor thin-film transistors,
wherein the demultiplexer further includes a plurality of second polycrystalline semiconductor thin-film transistors and a second control line, wherein the plurality of second polycrystalline semiconductor thin-film transistors is arranged between the connection terminals and the driving lines and corresponds to the driving lines in a one-to-one manner, and each of the second polycrystalline semiconductor thin-film transistors is configured to maintain the driving lines to have a second voltage which brings the respective connected pixels to be a respective non-selection state and wherein the second control line is configured to supply a second control signal which has a conductive voltage and a nonconductive voltage of the second polycrystalline semiconductor thin-film transistors to control electrodes of the second polycrystalline semiconductor thin-film transistors.

2. The matrix substrate according to claim 1 further comprising:
a first connection terminal electrically connected to the first control lines; and
a second connection terminal electrically connected to the second control lines,
wherein the demultiplexer includes a unit block which is arranged between one of the plurality of connection terminals and two or more of the driving lines and which includes two or more of the first polycrystalline semiconductor thin-film transistors and includes two or more of the second polycrystalline semiconductor thin-film transistors.

3. The matrix substrate according to claim 2,
wherein the unit block includes two of the first polycrystalline semiconductor thin-film transistors and two of the second polycrystalline semiconductor thin-film transistors and performs a one-to-two demultiplexing operation, and
the first connection terminal connected to a control electrode of one of the first polycrystalline semiconductor thin-film transistors which is connected to one of the driving lines connected to the unit block and which corresponds to a first row is electrically connected to a control electrode of one of the second polycrystalline semiconductor thin-film transistors connected to one of the driving lines which is connected to the unit block and which corresponds to a second row.

4. The matrix substrate according to claim 2,
wherein the unit block includes two of the first polycrystalline semiconductor thin-film transistors and two of the second polycrystalline semiconductor thin-film transistors and performs a one-to-two demultiplexing operation, and the first connection terminal connected to a control electrode of one of the first polycrystalline semiconductor thin-film transistors which is connected to one of the driving lines which is connected to the unit block and which corresponds to a first row is electrically connected to a control electrode of one of the second polycrystalline semiconductor thin-film transistors which is connected to one of the driving lines which is connected to the unit block and which corresponds to the first row through an inverter.

5. The matrix substrate according to claim 1,
wherein the demultiplexer further includes a plurality of third polycrystalline semiconductor thin-film transistors which are arranged in parallel with the first polycrystalline semiconductor thin-film transistors between the connection terminals and the driving lines, and control electrodes of the third polycrystalline semiconductor thin-film transistors are electrically connected to a connection terminal to which conductive voltages of the third polycrystalline semiconductor thin-film transistors are supplied in common in an addition mode.

6. The matrix substrate according to claim 1,
wherein the demultiplexer further includes a shield portion which covers the first polycrystalline semiconductor thin-film transistors and the second polycrystalline semiconductor thin-film transistors from above and which is electrically connected to a connection terminal to which a fixed potential is supplied.

7. The matrix substrate according to claim 1,
wherein
the first voltage is a conductive voltage of the thin-film transistor and the second voltage is a nonconductive voltage of the thin-film transistor.

8. The matrix substrate according to claim 7,
wherein the conversion elements include scintillators which convert radial rays into light beams and photoelectric conversion elements which convert light beams into charges, and the thin-film transistor is a stagger polycrystalline semiconductor thin-film transistor, and the first polycrystalline semiconductor thin-film transistors and the second polycrystalline semiconductor thin-film transistors are stagger polycrystalline semiconductor thin-film transistors.

9. A detection device comprising:
the matrix substrate set forth in claim 1;
the driving circuit set forth in claim 1; and
a control circuit configured to supply the conductive voltage of the first polycrystalline semiconductor thin-film transistors and a nonconductive voltage of the first polycrystalline semiconductor thin-film transistors to the first control lines and supply conductive voltages and nonconductive voltages of the second polycrystalline semiconductor thin-film transistors to the second control lines, wherein when a voltage used to supply the first voltages to the driving lines is supplied to the connection terminals, the control circuit is adapted to bring some of the first polycrystalline semiconductor thin-film transistors which are located between the connection terminals and certain driving lines, among the driving lines, to respective conductive states and to bring some of the second polycrystalline semiconductor thin-film transistors which are located between the connection terminals and the certain driving lines to respective nonconductive states so that the first voltage is supplied to the certain driving lines, the other of the first polycrystalline semiconductor thin-film transistors located between the connection terminals and the other of the driving lines which are different from the certain driving lines are brought to respective nonconductive states, and the other of the second polycrystalline semiconductor thin-film transistors located between the connection terminals and the other of the driving lines are maintained to be in respective conductive states so that the other driving lines are maintained to have the second voltage.

10. A detection system comprising:
the detection device set forth in claim 9;
a signal processor configured to process a signal supplied from the detection device;
a recording unit configured to record a signal supplied from the signal processor;
a display unit configured to display the signal supplied from the signal processor; and
a transmission processor configured to transmit the signal supplied from the signal processor.

11. A method for driving a detection device comprising:
arranging a plurality of pixels in a matrix, wherein each of the plurality of pixels includes a conversion element for converting radial rays or light beams into charges and a thin-film transistor for outputting electric signals corresponding to charges generated by the conversion elements, the conversion element has a first electrode, a second electrode, and a semiconductor layer arranged between the first electrode and the second electrode, the thin-film transistor has a gate electrode, a source electrode, and a drain electrode, and one of the source electrode and the drain electrode is connected to the first electrode;

arranging a plurality of driving lines in the column direction, each of which is connected to the gate electrode and connected to a number of the pixels in a row direction in common;

connecting a driving circuit which drives the pixels and the driving lines with each other by a plurality of connection terminals and the number of which is smaller than the number of driving lines; and including a plurality of first polycrystalline semiconductor thin-film transistors and a first control line in a demultiplexer, wherein the plurality of first polycrystalline semiconductor thin-film transistors is arranged between the connection terminals and the driving lines and corresponds to the driving lines in a one-to-one manner, each of the first polycrystalline semiconductor thin-film transistors is configured to supply a first voltage which brings the respective connected pixels into a respective selection state to the driving lines, and wherein the first control line is configured to supply a first control signal which has a conductive voltage of the first polycrystalline semiconductor thin-film transistors and a nonconductive voltage of the first polycrystalline semiconductor thin-film transistors to control electrodes of the first polycrystalline semiconductor thin-film transistors, wherein the demultiplexer further includes a plurality of second polycrystalline semiconductor thin-film transistors and a second control line, wherein the plurality of second polycrystalline semiconductor thin-film transistors is arranged between the connection terminals and the driving lines and corresponds to the driving lines in a one-to-one manner, and each of the second polycrystalline semiconductor thin-film transistors is configured to maintain the driving lines to have a second voltage which brings the respective connected pixels to be a respective non-selection state, and wherein the second control line is configured to supply a second control signal which has a conductive voltage of the second polycrystalline semiconductor thin-film transistors and a nonconductive voltage of the second polycrystalline semiconductor thin-film transistors to control electrodes of the second polycrystalline semiconductor thin-film transistors.

* * * * *